United States Patent [19]
Stein

[11] Patent Number: 6,085,349
[45] Date of Patent: Jul. 4, 2000

[54] METHOD FOR SELECTING CYCLIC REDUNDANCY CHECK POLYNOMIALS FOR LINEAR CODED SYSTEMS

[75] Inventor: Jeremy M. Stein, Tel-Aviv, Israel

[73] Assignee: Qualcomm Incorporated, San Diego, Calif.

[21] Appl. No.: 08/920,626

[22] Filed: Aug. 27, 1997

[51] Int. Cl.$^7$ ................................................ H03M 13/00
[52] U.S. Cl. ............................................ 714/778; 714/779
[58] Field of Search ...................... 371/37.04, 37.05, 371/37.01, 41, 37.4, 37.6; 714/778, 752, 758, 779

[56] References Cited

U.S. PATENT DOCUMENTS

| | | | |
|---|---|---|---|
| 4,901,307 | 2/1990 | Gilhousen et al. | 370/320 |
| 4,979,174 | 12/1990 | Cheng et al. | 371/41 |
| 5,103,451 | 4/1992 | Fossey | 371/37.6 |
| 5,103,459 | 4/1992 | Gilhousen et al. | 370/209 |
| 5,132,975 | 7/1992 | Avaneas | 371/37.6 |
| 5,550,870 | 8/1996 | Blanker et al. | 375/341 |
| 5,577,053 | 11/1996 | Dent | 371/37.4 |
| 5,710,784 | 1/1998 | Kindred et al. | 371/43 |

FOREIGN PATENT DOCUMENTS

| | | | |
|---|---|---|---|
| 0751625 | 1/1997 | European Pat. Off. | H03M 13/00 |
| 0767539 | 4/1997 | European Pat. Off. | H03M 13/00 |

OTHER PUBLICATIONS

Andrew J Viterbi, Convoluntional Codes and Their Performance in communication System, IEEE, pp. 751 to 772, Oct. 1967.

J.Bibb Cain, Punctured Conventional Codes of Rate (n–1)/n and Simplified Makimum Likelihood Decoding, IEEE, pp. 97 to 100, Jan. 1979.

"A Fast Algortihm for Computing Distance Spectrum of Convolutional Codes" by Cedervall et al.; IEEE Transactions on Information Theory, vol. 35 No. 6, Nov. 1989, pp. 1149–1160.

"Use of a Sequential Decoder to Analyze Convolutional Code Structure" by Forney, Jr.; IEEE Transactions on Information Theory, Nov. 1970, pp. 793–795.

"Optimum Cyclic Redundancy–Check Codes with 16–Bit Redundancy", IEEE Transactions on Communications, vol. 38 No. 1, Jan. 1990; New York, US pp. 111–114.

*Primary Examiner*—Albert De Cady
*Assistant Examiner*—Shelly A Chase
*Attorney, Agent, or Firm*—Russell B. Miller; Kyong H. Macek

[57] ABSTRACT

The method for selecting CRC polynomials (or CRC generators) for linear coded systems. In the exemplary embodiment, a communication system utilizes a concatenated code comprising a CRC code and a convolutional code. The CRC generators are selected based on the distance spectrums which have been computed for all possible CRC generators of a given length L. The distance spectrum comprises a listing of the number of paths (or code words) at various weights (or Hamming distance). These paths represent error information sequences I(x) which have diverged from an all-zero transmitted sequence (or the zero state) and have merged back into the zero state. The paths are checked by the CRC generators. If the CRC check passes, indicating that the error information sequence is undetected by the CRC check, the weight of this path is calculated and the distance spectrum for this CRC generator is updated. Otherwise, if the CRC does not check, the path is ignored. The CRC generator with the maximum minimum distance $d_{min}$ is selected.

15 Claims, 4 Drawing Sheets

METHOD FOR SELECTING CYCLIC REDUNDANCY CHECK POLYNOMIALS FOR LINEAR CODED SYSTEMS

BACKGROUND OF THE INVENTION

I. Field of the Invention

The present invention relates to communications. More particularly, the present invention relates to a method for selecting cyclic redundancy check (CRC) polynomials for linear coded systems.

II. Description of the Related Art

With the advent of digital communications and the need to transmit large amounts of data through an impaired and bandlimited channel, the need for coding of digital data to facilitate correct data reception is of great significance. Data transmissions are typically hindered by impairments in the transmission channel, namely additive noise and spurious signals within the transmission bandwidth. The transmit power is limited by practical considerations and the transmitted signal is attenuated by the path loss and may be distorted by other phenomenon, such as multipath, before it reaches the receiver. The design of a digital communications system entails the determination of the worse case signal quality at which the receiver is expected to operate. This signal quality is measured as an energy-per-bit-to-noise ratio (Eb/No) and is determined by the transmitted power, path loss and noise and interference. The minimum Eb/No which yields the desired level of performance is considered the system threshold level.

At the threshold level, the probability of error (PE) for any digital transmission scheme such as binary shift keying (BPSK), quaternary phase shift keying (QPSK), offset quaternary phase shift keying (OQPSK), or quadrature amplitude modulation (QAM) can be calculated. Typically the PE of the selected transmission scheme is not adequate for the application. Improvement in the PE is achieved by encoding the digital data before transmission and decoding the data at the receiver. The coding scheme is determined by the requirements of the application and the channel characteristic. Coding allows for detection and correction of errors in the transmitted data at the expense of a lower effective data rate.

Two classes of codes, convolutional codes and block codes, are utilized to improve PE. Convolutional codes provide good error correcting capability but typically output correlated bursts of error. Also, the Viterbi decoder supports the use of soft decisions to improve performance with minimal increase in hardware complexity. Block codes can be error detecting codes, such as the CRC code, or error detecting and correcting codes, such as the Reed-Solomon code. CRC code is utilized in many communication systems because of the performance provided by the CRC code and the simplicity in implementing the decoder. When a single code cannot provide the required level of performance, a concatenated code comprising two or more codes can be used. An exemplary communication system which employs a concatenated code comprising a convolutional code and a CRC code is a code division multiple access (CDMA) communication system as disclosed in U.S. Pat. No. 4,901, 307, entitled "SPREAD SPECTRUM MULTIPLE ACCESS COMMUNICATION SYSTEM USING SATELLITE OR TERRESTRIAL REPEATERS", and U.S. Pat. No. 5,103, 459, entitled "SYSTEM AND METHOD FOR GENERATING WAVEFORMS IN A CDMA CELLULAR TELEPHONE SYSTEM", both assigned to the assignee of the present invention and incorporated by reference herein.

A rate 1/N convolutional encoder encodes each input bit into N code bits called a code branch according to a set of N generator polynomials. Each generator polynomial G(x) computes one code bit. The N code bits are combined into an N-bit code branch. The constraint length K of the encoder is the number of data bits used in the encoding process and determines the error correcting capability of the code. Long constraint length K yields better performance at the expense of hardware and computational complexity. A state is designated by the K-1 prior input bits and there are $2^{K-1}$ possible states. For each of the $2^{K-1}$ states, a '0' or '1' input bit results in one of two possible code branches. Since each input bit is encoded into N code bits, the code rate for the convolutional encoder is 1/N. Other code rates could be obtained from a 1/N code by puncturing the code bits. Punctured codes are thoroughly treated by J. Cain, G. Clark, and J. Geist in "Punctured Convolutional Codes of Rate (n−1)/n and Simplified Maximum Likelihood Decoding," IEEE Transaction on Information Theory, IT-25, pgs. 97–100, January 1979.

Typically, a Viterbi decoder is used to decode the transmitted code branches at the receiver. A discussion on the theory and operation of the Viterbi decoder is contained in the paper "Convolutional Codes and Their Performance in Communication Systems" by A. Viterbi, IEEE Transaction on Communication Technology, Vol. COM19, no. 5, October 1971, pgs. 821–835. Under certain assumptions about the channel noise, the Viterbi decoder performs the maximum likelihood decoding of the transmitted data path. For each received code branch, the branch metric of all branches entering each state is computed and added to the corresponding prior path metrics. The best path entering each state is selected and stored as the new path metric. The selected path is stored in a path memory. In "Development of Variable Rate Viterbi Decoder and its Performance Characteristics," Sixth International Conference on Digital Satellite Communications, Phoenix, AZ, September 1983, Y. Yasuda et al. show that the survivor paths with the lowest path metric all converge to the same path after a certain chain back depth. Thus, a Viterbi decoded bit is obtained by tracing a path back by at least the chain back distance.

A CRC code is a linear, systematic, and cyclic block code that can reliably detect a burst of errors of length n-k or less, where k is the input data length and n is the output code length. CRC coding is well known in the art and a good treatment of the topic is found in a number of references, including "Error Control Coding: Fundamentals and Applications" by S. Lin and D. Costello", Prentice Hall, 1985. The CRC code is determined by the CRC polynomial P(x) which is of degree (n-k). For an n-k CRC code, blocks of k data symbols are encoded into blocks of n code symbols called a code word.

In a systematic block code, the k data symbols form the first k code symbols of the code word. The n-k parity symbols are formed by a linear combination of the k data symbols according to the generator polynomial P(x). Because of the linear, systematic, and cyclic properties of the CRC code, the encoding process is easily achieved with simple shift registers and combinatory logic. Similarly, decoding is easily performed at the receiver by dividing the received symbols with the generator polynomial. The division can be achieved with the same simple circuit used to generate the parity symbols. If there are no transmission errors, the content of the shift register is zero.

In the exemplary CDMA communication system, the convolutional code and the CRC code are determined by the "TIA/EIA/IS-95 Mobile Station-Base Station Compatibility Standard for Dual-Mode Wideband Spread Spectrum Cellular System", hereinafter referred to as the IS-95 standard. The convolutional code specified by the IS-95 standard is an optimal rate 1/2, K=9 convolutional code for the forward link and a rate 1/3, K=9 convolutional code for the reverse link. However, the CRC code specified by the IS-95 standard is selected with the assumption that the input data is random (e.g. white noise). However, this assumption is not valid for a concatenated code, such as that used in the CDMA communication system, and results in a sub-optimal CRC code.

SUMMARY OF THE INVENTION

The present invention is a novel and improved method for selecting CRC polynomials (or CRC generators) for linear coded systems. In the exemplary embodiment, the system utilizes a concatenated code comprising a CRC code and a convolutional code. The CRC generators are selected based on the distance spectrums which have been computed for all CRC generators of a given length L. Each distance spectrum comprises a listing of the number of paths (or code words) at various weights (or Hamming distances). The weights determine the error detection and correction capability of the code. In the exemplary embodiment, only paths with weight of greater than or equal to the free distance $d_{free}$ of the convolutional code and less than twice $d_{free}$ are considered. Paths with weight of greater than twice $d_{free}$ are ignored to minimize complexity and because they have negligible impact in the performance of the code.

It is an object of the present invention to minimize the probability of undetected error in a concatenated code comprising a CRC code and a convolutional code. In the exemplary embodiment, the distance spectrum comprises the number of paths at various weights. These paths represent error information sequences I(x) which have diverged from a transmitted all-zero sequence (or the zero state) and have merged back into the zero state. A systematic method of generating the information sequences I(x) and the computation of the weight of the code word corresponding to the information sequence I(x) are described in a reference paper stated below. In the present invention, the information sequences I(x) which have merged back into the zero state are checked by the CRC generators. For each CRC generator, if the CRC check passes, indicating that the error information sequence is undetected by the CRC check, the weight of this path is calculated and the distance spectrum for this CRC generator is updated by incrementing the number of paths at this weight. Otherwise, if the CRC does not check, this error information sequence is ignored since the CRC check is able to the detect the error. In the exemplary embodiment, the CRC generators which have the highest minimum distance $d_{min}$ are selected. If more than one CRC generator has the same highest $d_{min}$, the CRC generators with the least number of paths at the highest $d_{min}$ is selected.

It is another object of the present invention to minimize the complexity of the CRC code selection process. In the exemplary embodiment, paths with weight greater than twice $d_{free}$ are not considered since they have negligible impact in the performance of the code. By limiting the range of weights to be considered, the trellis of the information sequences I(x) can be pruned to minimize complexity.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

The present invention is a method for selecting CRC polynomials (or CRC generators) for a concatenated code comprising a CRC code and an additional code. In the exemplary embodiment, the concatenated code comprises a CRC code and a convolutional code. In the prior art, such as the IS-95 standard, the CRC generator is selected with the assumption that the decoded data is random when the CRC check should detect an error. However, for concatenated codes, this is not a valid assumption since the data is also encoded with a convolutional code which has a known structure. Optimal CRC generators, such as those selected by the present invention, provide high performance while minimizing the probability of undetected decoding errors. As used in this specification, optimal CRC generators denote the selected CRC generators based on the criterias used in the CRC generator selection process.

Figure 1:
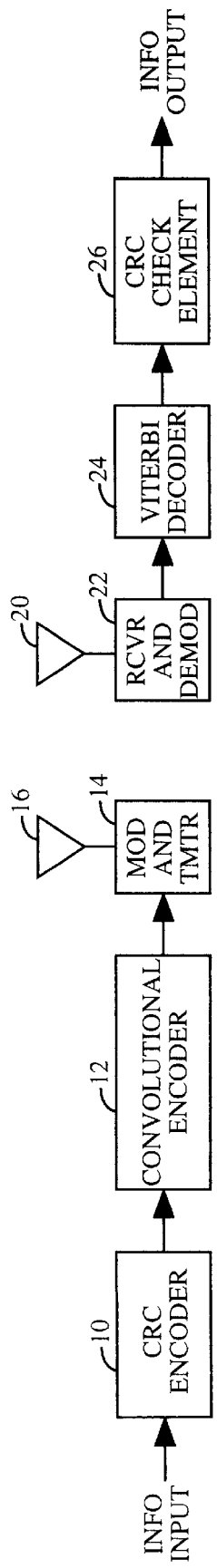
FIG. 1 is a block diagram of an exemplary linear coded system of the present invention.

The block diagram of the exemplary communication system which utilizes the concatenated code of the present invention is shown in FIG. 1. The information sequence I(x) is provided to CRC encoder 10 which block encodes the information sequence with the CRC generator P(x). The information sequence, the CRC parity bits, and zero or more code tail bits are provided to convolutional encoder 12 which encodes the bits with the generator G(x). The code symbols from convolutional encoder 12 are provided to modulator and transmitter (MOD AND TMTR) 14 which processes the symbols for transmission through antenna 16. At the receiver, the signal is received by antenna 20 and routed to receiver and demodulator (RCVR AND DEMOD) 22 which processes the received signal to provide demodulated symbols. The demodulated symbols are provided to Viterbi decoder 24 which decodes the symbols and provides the decoded data to CRC check element 26. CRC check element 26 performs the CRC check and provides the checked data. CRC check element 26 also provides the CRC bit which indicates whether the CRC check passed or failed.

In accordance with the present invention, optimal CRC generators P(x) of a given length L can be determined for a given concatenated code by computing the distance spectrums for all CRC generators. A distance spectrum comprises a listing of the number of paths (or code words) at various weights (or Hamming distances). The Hamming distance is a measure of the difference between two paths and determines the error detection and correction capabilities of the code. In the exemplary embodiment, the distance spectrum tabulates the number of paths having weights greater than or equal to the free distance $d_{free}$ of the convolutional code and less than twice $d_{free}$. Paths with weights greater than twice $d_{free}$ are ignored because they have negligible impact in the performance of the code.

Limitation on the range of weights to be considered prunes the trellis during the computation of the distance spectrum, thereby minimizing the complexity CRC generator selection process.

In the exemplary embodiment, the transmission system can be assumed to be transmitting an all-zero sequence, hereinafter referred to as the all zero path. During transmission, an error in transmission can occur which causes the received sequence to diverge from the zero state. Eventually, the error terminates and the received sequence merges back to the zero state. In the present invention, error sequences which can be detected by the CRC code are not tabulated because a frame erasure can be indicated or a request for retransmission can be sent for the frame corresponding to the sequence received in error. However, error sequences which are undetected by the CRC code (e.g. the CRC code indicates the error sequence as valid when, in fact, an error has occurred) can cause degradation in the performance of the system.

Since both the CRC code and the convolutional code are linear, by the associative property of multiplying matrices for the code generation, the concatenated code is also linear. Common evaluation criterias for linear codes are the free distance $d_{free}$ (or minimum distance $d_{min}$) of the code and the distance spectrum of the code. Since the concatenated code is also linear, $d_{min}$ can be determined by calculating the minimum weight of the non-zero code words. For a linear code, the weights for the paths can be determined by comparing the paths with the all zero path. For convolutional codes, the all-zero path comprises all-zero code branches. Therefore, the weight of the non-zero paths can be computed by summing the weight of all code bits along the path. As used in this specification, $d_{free}$ is the minimum distance of the convolutional code only and $d_{min}$ is the minimum distance of the concatenated code or the errors that the CRC check will not detect.

In the exemplary embodiment, only paths having one error event are considered. Paths with two or more error events are not considered since they greatly increase the complexity of the search while having minimal influence on the outcome of the CRC generator selection process. The non-zero paths are error information sequences I(x) which diverge from the zero state and subsequently merge with the zero state. If the path has merged with the zero state, a CRC check is performed. If the CRC check passes, indicating that this error information sequence is undetected by the CRC generator, the weight of this path is computed and the distance spectrum for this CRC generator is updated correspondingly. Otherwise, if the CRC check fails, this path is ignored in the distance spectrum computation. Methods for computing the weight of a path are well known in the art. One such method is described in the reference entitled "Use of a Sequential Decoder to Analyze Convolutional Code Structure", by G. David Forney Jr., IEEE Transaction on Information Theory, vol. IT-16, pgs. 793–795, November 1970, hereinafter the Forney reference.

Figure 2:
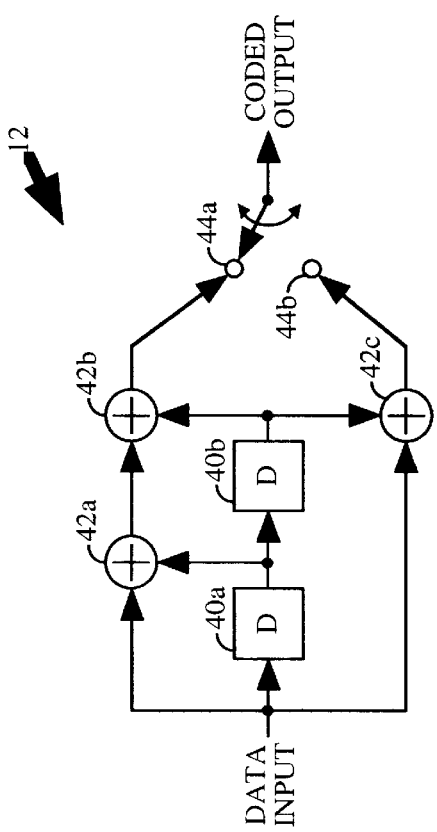
FIG. 2 is a block diagram of a exemplary convolutional encoder.

A block diagram of an exemplary convolutional encoder 12 is shown in FIG. 2. Convolutional encoder 12 is a constraint length K=3, rate 1/2 encoder since for every data input bit there are two coded output bits sampled at nodes 44a and 44b. Convolutional encoder 12 is defined by the polynomial generators $G_1(x)=1+X+X^2$ and $G_2(x)=1+X^2$. The state of the encoder is defined by the binary contents of memory elements (D) 40a and 40b. A zero state means that the contents of memory elements 40a and 40b are zero. The next state of the encoder is obtained by shifting the data input bit into memory element 40a and shifting the previous contents of memory element 40a into memory element 40b. The coded outputs are calculated by the XOR functions which are implemented with adders 42 in FIG. 2.

Figure 3:
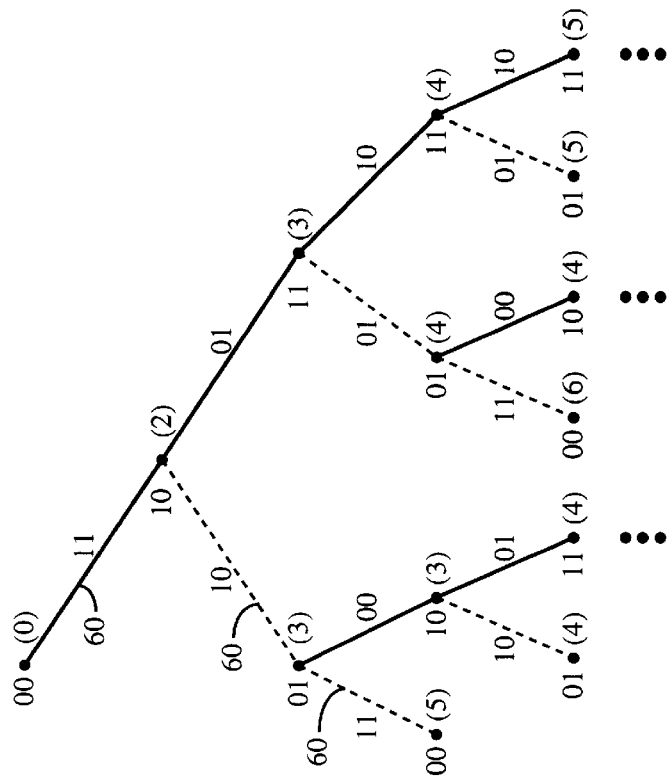
FIG. 3 is an exemplary tree diagram of the information sequences I(x) used to compute the distance spectrums.

In the exemplary embodiment, distance spectrums are computed for all CRC generators of a given length using all information sequences I(x). A method for systematic generation of the information sequences I(x) is described in detail in the Forney reference. I(x) can be represented by a trellis tree diagram as shown in FIG. 3. This tree corresponds to the exemplary convolutional encoder 12 of FIG. 2. The first information bit in I(x) is assumed to be a one, since only paths that diverge from the zero state are considered. The second information bit can be a zero or a one. For each bit hypothesis (e.g. "0" and "1"), the code bits are computed and the next state is determined. In FIG. 3, the "0" hypothesis are shown by the dashed lines and the "1" hypothesis are shown by the solid lines. The states are at the nodes. In the middle of the lines the code bits are shown that correspond to the information bit (hypothesis) and state. For each of the two hypothesis for the second information bit, the third information bit can be one of two hypothesis ("0" and "1"). Again, the code bits are computed for each hypothesis and the next state determined. The cumulative weight of each path can be computed by summing the non zero code bits along the path. In FIG. 3, the weights of the paths are computed and shown by the values enclosed by parenthesis. As can be seen in FIG. 3, the tree grows exponentially with each additional information bit. In the exemplary embodiment, the tree is pruned such that paths which have weight of greater than twice $d_{free}$ are eliminated from further consideration. This pruning simplifies the complexity of the trellis and thus the CRC generator selection process. When the tree node ends in the all zero state, an error sequence I(x) has been found and the tree is not proceeded from this node. In FIG. 3, it can be seen that path 60 starts in the all zero state and ends in the all zero state. Path 60 has a distance of 5 from the all zero sequence and is also termed as having a weight of 5.

In the exemplary embodiment, the distance spectrums of all CRC generators for a given length L are computed and stored in a distance spectrum table. The number of CRC generators is determined by the length of the CRC code. Specifically, for a CRC code of length L, $2^{L-1}$ CRC generators are considered. The first bit and the last bit of the CRC generators are always "1". A table listing all candidates for CRC generators for an exemplary 4-bit CRC code is shown in Table 1.

TABLE 1

Possible 4-bit CRC Generators

| CRC P(x) (binary) | CRC P(x) (octal) |
|---|---|
| 10001 | 21 |
| 10011 | 23 |
| 10101 | 25 |
| 10111 | 27 |
| 11001 | 31 |
| 11011 | 33 |
| 11101 | 35 |
| 11111 | 37 |

In the exemplary embodiment of the CRC generator selection process, the distance spectrums for all CRC generators of a given length L are computed using information sequences I(x) and stored in a distance spectrum table. In the exemplary embodiment, two loops are utilized to compute the distance spectrums. The first loop cycles through the information sequences I(x). The second loop resides within the first loop and cycles through all CRC generators P(x). For each information sequence $I_j(x)$, a determination is made whether the sequence has merged back into the zero state. If the sequence has merged back into the zero state, this sequence is checked by all CRC generators in the second loop. For each CRC generator $P_i(x)$, if the sequence passes the CRC check, the weight of this sequence is computed and the entry in the distance spectrum table for that CRC generator and that weight is updated.

For convolutional codes, the zero state is defined by the K−1 bits in the shift register, where K is the constraint length of the convolutional encoder. When the encoder is in the zero state, a zero information bit input to the encoder results in the next state being the zero state and the output code bits being zero. The information sequence I(x) comprises a sequence of bits, wherein the first bit in the sequence is a "1"because only paths which diverged from the zero state are considered. As additional bits are generated, the encoder proceeds through a series of states. An I(x) sequence is found when the zero state is reached for the first time.

The information sequences I(x) can be of various lengths. For CRC generators P(x) which are represented by odd numbers, P(x) divides I(x) if and only if P(x) divides $x^n$I(x) for all n=0, 1, 2, and so on. Thus, by checking if P(x) divides I(x) with no remainder (e.g. CRC check passes), the sequences with only one error event can be considered without taking into account the block size of the CRC code. Viewed another way, the information sequence I(x) being checked is filled with n zeros such that the sequence fills a frame regardless of the frame size.

Good choices for CRC generators are the ones that result in the maximum minimum distance $d_{min}$ for a given CRC length and convolutional code. The minimum distance $d_{min}$ and distance spectrum are determinative of the performance of the code. In the exemplary embodiment, the criteria used to select the optimal CRC generators is the distance spectrum of the concatenated code. CRC generators which have the highest $d_{min}$ are selected as the optimal CRC generators. In case of a tie (e.g. two or more CRC generators having the highest $d_{min}$), the CRC generator with the minimum number of paths at the highest $d_{min}$ is selected. Again, if there is a tie, the next highest weight is considered. The process is repeated until one CRC generator is selected or all weights in the distance spectrum table are considered. Other criterias, such as selecting the lowest probability of error which can be computed from the distance spectrum, can be used and are within the scope of the present invention.

In the alternative embodiment of the CRC generator selection process, the distance spectrum for each CRC generator is computed and compared against the best distance spectrum. Initially, the best distance spectrum is initialized to a bad state (e.g. by setting the lowest weight in the distance spectrum with a high number of paths). If the distance spectrum of the current CRC generator is better than the best distance spectrum, the best distance spectrum is updated with the distance spectrum for this CRC generator, and the CRC generator is noted. The process is repeated until the distance spectrum for all CRC generators have been generated and compared. The various embodiments to select CRC generators utilizing the concept described herein are within the scope of the present invention.

I. Selecting Optimal CRC Codes

Figure 4:
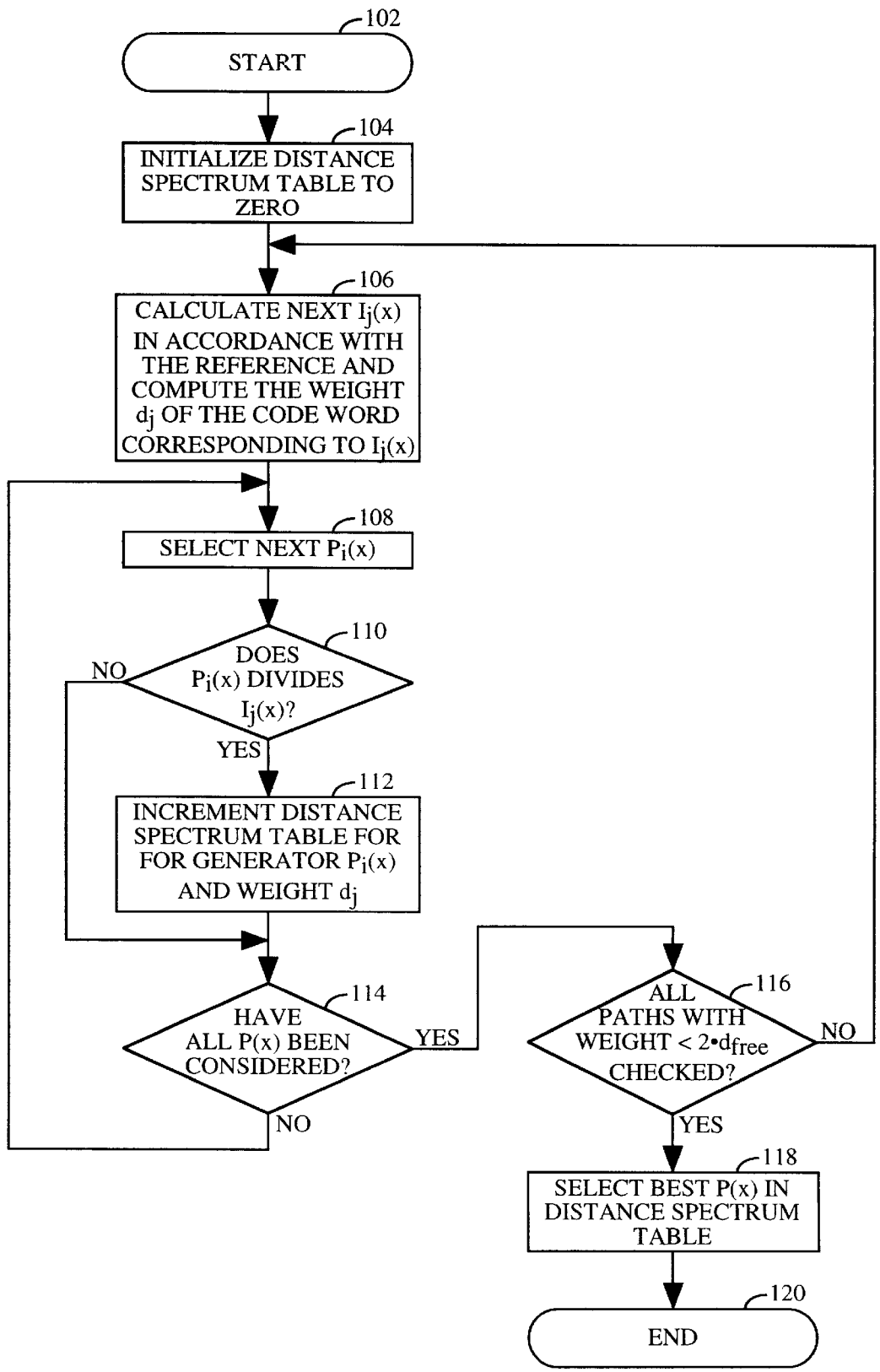
FIG. 4 is an exemplary flow diagram of the CRC generator selection process of the present invention.

An exemplary flow diagram of the CRC generator selection process of the present invention is illustrated in FIG. 4.

The selection process starts at block 102. In the first step, at block 104, the distance spectrum table which is used to store the computed distance spectrums for all CRC generators is initialized with zeros. At block 106, the new information sequence $I_j(x)$ is selected in accordance with the method described in the aforementioned Forney reference. The weight $d_j$ of the code word corresponding to $I_j(x)$ is calculated by summing the code bits along the path, as described before. At block 108, the first CRC generator $P_i(x)$ is selected. A check is then made to determine whether $P_i(x)$ divides $I_j(x)$, at block 110. This can be performed by checking the remainder of the divide operation. If $P_i(x)$ does not divide $I_j(x)$, the process proceeds to block 114. If $P_i(x)$ does divide $I_j(x)$, the entry in the distance spectrum table for the CRC generator $P_i(x)$ and the weight $d_{i,j}$ is updated by incrementing the value stored in that entry, at block 112. At block 114, a determination is made whether all CRC generators P(x) have been considered. If not, the process returns to block 108 and the next CRC generator $P_i(x)$ is selected. Otherwise, if all CRC generators P(x) have been considered, the process proceeds to block 116.

At block 116, a determination is made whether all paths having a weight of less than twice $d_{free}$ have been checked. If the answer is no, the process returns to block 106 and a new information sequence $I_j(x)$ is calculated. Otherwise, if all paths with weight of less than twice $d_{free}$ have been checked, the process continues to block 118 where the best CRC generator P(x) in the distance spectrum table is selected. The process then terminates at block 120.

The selection of which best CRC generators P(x) can be made with reference to a set of criteria. In the exemplary embodiment, the criteria utilized attempts to maximize the minimum distance of the concatenated code and to minimize the number of paths (or code words) at each distance. This criteria is easy to apply and provides good results since the performance of the CRC code is largely determined by the minimum distance. However, other criteria, such as the probability of error, can be considered and are within the scope of the present invention.

Figure 5:
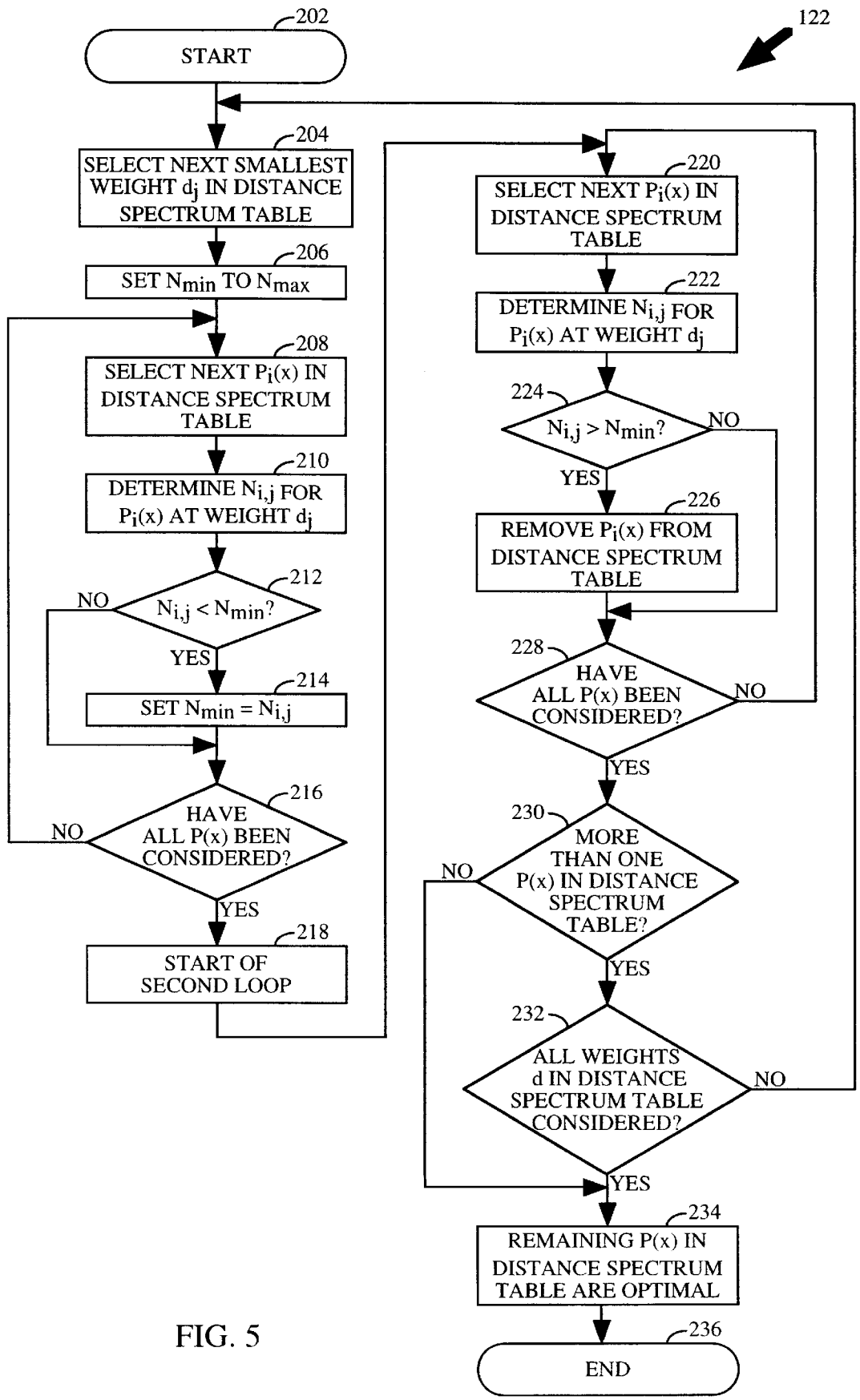
FIG. 5 is an exemplary flow diagram of the best CRC generator selection process of the present invention.

An exemplary flow diagram of the best CRC generator selection process (block 118 in FIG. 4) is illustrated in FIG. 5. The selection process starts at block 202. At block 204, the process selects the smallest weight $d_j$ in the distance spectrum table. In the exemplary embodiment, for a rate 1/2, K=9 convolutional encoder with a $d_{free}$ of 12, the smallest weight is 0–11(see Table 2). In the first loop, the process determines the minimum number of paths $N_{min}$ at this weight. Before entering the first loop, the minimum number of paths $N_{min}$ is initialized to $N_{max}$, a high value, at block 206. At block 208, the first step within the first loop, a CRC generator $P_i(x)$ in the distance spectrum table is selected. Next, the number of paths $N_{i,j}$ for this CRC generator $P_i(x)$ at weight $d_j$ is determined, at block 210. This number of paths $N_{i,j}$ is compared against the minimum number of paths for all CRC generators P(x) at this weight, at block 212. If the number of paths $N_{i,j}$ for this CRC generator $P_i(x)$ is not less than $N_{min}$, the process proceeds to block 216. Otherwise, if the number of paths $N_{i,j}$ for this CRC generator $P_i(x)$ is less than $N_{min}$, $N_{i,j}$ is set as the new $N_{min}$, at block 214. At block 216, a determination is made whether all CRC generators P(x) in the distance spectrum table have been considered. If one or more CRC generators have not been considered, the process returns to block 208 and the next CRC generator $P_i(x)$ is considered. Otherwise, the process proceeds to block 218 which is the start of the second loop.

The second loop removes sub-optimal CRC generators in the distance spectrum table from consideration. At block 220, the first step within the second loop, a CRC generator $P_i(x)$ in the distance spectrum table is selected. Next, the number of paths $N_{i,j}$ for this CRC generator $P_i(x)$ at weight $d_j$ is determined, at block 222. This number of paths $N_{i,j}$ is compared against the minimum number of paths $N_{min}$ which has been ascertained from the first loop, at block 224. If the number of paths $N_{i,j}$ for this CRC generator $P_i(x)$ is not greater than $N_{min}$, the process proceeds to block 228. Otherwise, if the number of paths $N_{i,j}$ for this CRC generator $P_i(x)$ is greater than $N_{min}$, denoting that this CRC generator $P_i(x)$ has more paths at this weight $d_j$ than the optimal CRC generator, this CRC generator $P_i(x)$ is removed from the distance spectrum table, at block 226. At block 228, a determination is made whether all CRC generators P(x) in the distance spectrum table have been considered.

In the second loop, only CRC generators which have not been eliminated from the distance spectrum table need to be considered. The CRC generators which have been removed from the distance spectrum table from previous passes through the second loop can be ignored, since they are sub-optimal. If one or more CRC generators have not been considered, the process returns to block 220 and the next CRC generator is considered. Otherwise, the process proceeds to block 230.

Block 118 determines the optimal CRC generator for a given CRC length and convolutional code. In some instances, two or more CRC generators are optimal, because they have identical distance spectrums. Block 118 terminates when only one CRC generator $P_i(x)$ remains in the distance spectrum table or when all weights in the distance spectrum table have been considered.

At block 230, a determination is made whether more than one CRC generator P(x) is remaining in the distance spectrum table. If only one CRC generator is remaining in the distance spectrum table, the process proceeds to block 234. Otherwise, a determination is made whether all weights d in the distance spectrum table have been considered, at block 232. If all weights have not been considered, the process returns to block 204 and the next weight is considered. Otherwise, the process proceeds to block 234 where the remaining CRC generators P(x) in the distance spectrum table are considered optimal CRC generators for this CRC length and convolutional code. The process terminates at block 236.

II. Exemplary CRC Code Selection

An exemplary distance spectrum table for a 4-bit CRC generator in combination with a rate 1/2, K=9 convolutional code which is defined by the generators $G_0=753$ (octal) and $G_1=561$ (octal) are illustrated in Table 2. The eight possible CRC generators are those listed in Table 1. For each CRC generator, the distance spectrum is computed. The CRC generator P(x)=21 (octal) is the optimal CRC generator because it has the minimum number of paths (1) at the highest minimum distance $d_{min}$ of 14. Other CRC generators P(x)=25, P(x)=33, P(x)=35, and P(x)=37 also have $d_{min}$ of 14 but these CRC generators have higher number of paths at $d_{min}$.

The distance spectrums for the optimal CRC generators of various lengths in a concatenated code comprising a R=1/2, K=9 convolutional code which is defined by the generators $G_0=753$ (octal) and $G_1=561$ (octal) is illustrated in Table 3. The distance spectrum for the convolutional encoder, without the CRC code, is shown in the second column in Table 3 for comparison. Notice that as the code length increases, the free distance $d_{free}$ also increases and the performance is improved.

TABLE 2

Distance Spectrum Table for 4-bit CRC Generators

| Weight (Hamming distance) | no CRC | CRC P(x)=21 | CRC P(x)=23 | CRC P(x)=25 | CRC P(x)=27 | CRC P(x)=31 | CRC P(x)=33 | CRC P(x)=35 | CRC P(x)=37 |
|---|---|---|---|---|---|---|---|---|---|
| 0–11 | 0 | 0 | 0 | 0 | 0 | 0 | 0 | 0 | 0 |
| 12 | 11 | 0 | 1 | 0 | 1 | 3 | 0 | 0 | 0 |
| 13 | 0 | 0 | 0 | 0 | 0 | 0 | 0 | 0 | 0 |
| 14 | 50 | 1 | 2 | 2 | 1 | 9 | 3 | 4 | 5 |
| 15 | 0 | 0 | 0 | 0 | 0 | 0 | 0 | 0 | 0 |
| 16 | 286 | 24 | 15 | 25 | 20 | 17 | 19 | 14 | 13 |
| 17 | 0 | 0 | 0 | 0 | 0 | 0 | 0 | 0 | 0 |
| 18 | 1630 | 106 | 110 | 81 | 105 | 106 | 99 | 116 | 108 |
| 19 | 0 | 0 | 0 | 0 | 0 | 0 | 0 | 0 | 0 |
| 20 | 9639 | 570 | 623 | 630 | 609 | 632 | 600 | 643 | 572 |
| 21 | 0 | 0 | 0 | 0 | 0 | 0 | 0 | 0 | 0 |
| 22 | 55152 | 3470 | 3431 | 3440 | 3362 | 3562 | 3529 | 3483 | 3522 |

TABLE 3

Distance Spectrum of CRC-Convolutional Code

| Weight (Hamming distance) | no CRC | CRC P(x)=21 | CRC P(x)=23 | CRC P(x)=25 | CRC P(x)=27 | CRC P(x)=31 | CRC P(x)=33 | CRC P(x)=35 | CRC P(x)=37 |
|---|---|---|---|---|---|---|---|---|---|
| 0–11 | 0 | 0 | 0 | 0 | 0 | 0 | 0 | 0 | 0 |
| 12 | 11 | 1 | 0 | 0 | 0 | 0 | 0 | 0 | 0 |
| 13 | 0 | 0 | 0 | 0 | 0 | 0 | 0 | 0 | 0 |
| 14 | 50 | 13 | 5 | 1 | 0 | 0 | 0 | 0 | 0 |
| 15 | 0 | 0 | 0 | 0 | 0 | 0 | 0 | 0 | 0 |

TABLE 3-continued

Distance Spectrum of CRC-Convolutional Code

| Weight (Hamming distance) | no CRC | CRC P(x)= 21 | CRC P(x)= 23 | CRC P(x)= 25 | CRC P(x)= 27 | CRC P(x)= 31 | CRC P(x)= 33 | CRC P(x)= 35 | CRC P(x)= 37 |
|---|---|---|---|---|---|---|---|---|---|
| 16 | 286 | 76 | 44 | 24 | 9 | 2 | 0 | 0 | 0 |
| 17 | 0 | 0 | 0 | 0 | 0 | 0 | 0 | 0 | 0 |
| 18 | 1630 | 425 | 206 | 106 | 53 | 30 | 10 | 2 | 0 |
| 19 | 0 | 0 | 0 | 0 | 0 | 0 | 0 | 0 | 0 |
| 20 | 9639 | 2340 | 1185 | 570 | 305 | 155 | 99 | 46 | 6 |
| 21 | 0 | 0 | 0 | 0 | 0 | 0 | 0 | 0 | 0 |
| 22 | 55152 | 13779 | 6863 | 3470 | 1729 | 859 | 432 | 231 | 61 |

The improvement provided by the present invention can be illustrated by way of an example. In accordance with IS-95 standard, the 6-bit CRC used for one-eighth rate is P(x)=107 (octal). This CRC generator in conjunction with the R=1/2, K=9 convolutional encoder produce a CRC-convolutional concatenated code with a minimum distance $d_{min}$=14. Referring to Table 3, the 6-bit CRC generator which produces the highest free distance is P(x)=125 (octal). The concatenated code with this CRC generator and the same R=1/2, K=9 convolutional code produce a $d_{min}$=16. Thus, the minimum distance of the concatenated code using the CRC code selected by the present invention is two higher than the CRC generator specified by IS-95.

III. Computing Distance Spectrum

For each CRC generator $P_i(x)$, the distance spectrum can be computed by calculating the Hamming distance (or the weight) of the code word corresponding to the information sequence. As stated above, a concatenated code comprising two linear codes are also linear. For the all-zero sequence, using the nominal CRC implementation wherein the registers are initialized with zeros, the CRC parity bits are also zero. Thus, the concatenated code word for the all-zero information steam is also zero. Therefore, in order to find $d_{min}$, it is sufficient to calculate the weight of the non-zero code words.

In the present invention, only a single error event of the convolutional code (e.g. only paths that diverge and merge once with the all-zero sequence) is considered. Paths with a distance of twice $d_{free}$ are ignored without loss in accuracy because of the low contribution to the performance of the CRC code from these code words. First, consider an information sequence, denoted as I(x), that starts with a "1"(e.g. diverges from the zero state) and after several information bits merges to the zero state. In the exemplary embodiment, only CRC polynomials, denoted as P(x), that are represented by odd numbers are considered. In this case, P(x) divides by I(x) if and only if P(x) divides by $x^n I(x)$ for all n=0, 1, 2, ... Thus, if all paths I(x) that divide by P(x) with no remainder are searched, the partial distant spectrum (considering only one error even) of the concatenated code can be calculated without regard of the length of the data sequence (e.g. the CRC block or frame size).

The present invention has been described in the context of a rate 1/2, K=9 convolutional code specified by IS-95 standard for the forward link. The present invention can also be applied to the rate 1/3, K=9 convolutional code specified by the IS-95 standard for the reverse link. In fact, the present invention can be applied to any convolutional code.

Although the present invention has been described in the context of a concatenated code comprising a CRC code and a convolutional code, the present invention can be applied to other concatenated codes. Some exemplary concatenated codes include a convolutional code and a Reed-Solomon code, a convolutional code and another convolutional code, and a CRC code, a convolutional code, and a Reed-Solomon code. The application of the present invention to various concatenated codes are within the scope of the present invention.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. A method for selecting CRC generators in a concatenated code comprising the steps of:
    computing distance spectrums for all CRC generators of a given length;
    selecting optimal CRC generators from said distance spectrums.

2. The method of claim 1 wherein said computing step comprises the steps of:
    determining an information sequence;
    determining whether said information sequence has merged back to a zero state;
    checking said information sequence against all CRC generators if said information sequence has merged back to said zero state;
    calculating a weight of said information sequence if said information sequence passes said checking step; and
    updating said distance spectrum of each CRC generator for which said information sequence passes said checking step.

3. The method of claim 2 wherein said computing step further comprises the step of:
    eliminating information sequences which have weights exceeding twice a free distance of said concatenated code.

4. The method of claim 2 wherein said checking step comprises the step of:
    determining whether said CRC generators divide said information sequence.

5. The method of claim 1 wherein said selecting step comprises the steps of:
    determining minimum distances of said CRC generators from said distance spectrums; and
    selecting CRC generators which have a highest minimum distance.

6. The method of claim 5 further comprising the steps of:

determining number of paths for CRC generators having identical highest minimum distance; and selecting CRC generators which have a lowest number of paths.

7. The method of claim 6 further comprising the steps of:

selecting CRC generators based on a next highest weight in said distance spectrums if said highest minimum distance and number of paths are identical for two or more CRC generators.

8. The method of claim 7 wherein said selecting CRC generators based on said next highest weight step comprises the steps of:

determining said next highest weight in said distance spectrums;

determining number of paths for said two or more CRC generators at said next highest minimum distance; and selecting CRC generators which have a lowest number of paths at said next highest minimum distance.

9. The method of claim 8 further comprising the step of:

repeating said selecting CRC generators based on said next highest weight step until only one CRC generator is selected or all weights in said distance spectrums are considered.

10. The method of claim 1 wherein said concatenated code comprises a CRC code and a convolutional code.

11. The method of claim 10 wherein said convolutional code is a rate 1/2, K=9 convolutional code.

12. The method of claim 10 wherein said convolutional code is a rate 1/3, K=9 convolutional code.

13. The method of claim 10 wherein said convolutional code conforms to IS-95 standard.

14. The method of claim 10 wherein said given length of said CRC generators is greater than one.

15. The method of claim 1 wherein said concatenated code comprises a CRC code and a linear code.

* * * * *